(12) United States Patent
Franck et al.

(10) Patent No.: US 7,368,994 B2
(45) Date of Patent: May 6, 2008

(54) CLASS AB ENHANCED TRANSCONDUCTANCE SOURCE FOLLOWER

(75) Inventors: Stephen J Franck, Felton, CA (US); Sateh M Jalaleddine, Santa Clara, CA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 11/612,354

(22) Filed: Dec. 18, 2006

(65) Prior Publication Data
US 2007/0109052 A1    May 17, 2007

Related U.S. Application Data

(62) Division of application No. 10/737,937, filed on Dec. 17, 2003, now Pat. No. 7,151,410.

(51) Int. Cl.
*H03F 3/16* (2006.01)
(52) U.S. Cl. .................................. 330/277; 330/311
(58) Field of Classification Search ............... 330/253, 330/262–264, 277, 301, 310, 311
See application file for complete search history.

(56) References Cited

U.S. PATENT DOCUMENTS 6,590,453 B2 *   7/2003   Tran et al. .................. 330/255

* cited by examiner

*Primary Examiner*—Khanh Van Nguyen

(57) ABSTRACT

A low voltage, high bandwidth, enhanced transconductance, source follower circuit constructed from MOS FET devices, which operates in a class AB mode. The drain current of the source follower is sensed with a folded cascode device. The sensed current is multiplied by a common source device of same type (NMOS or PMOS) as the source follower, and directed to the output load. Over limit current load at the source follower drain is sensed by a common source device of the opposite type (NMOS or PMOS), which also supplies the necessary extra current to the output load. This allows the device to supply significantly more than the quiescent current in both sourcing and sinking the output. Average power consumption for driving a given load is significantly reduced, while maintaining the large bandwidth of traditional source follower designs, and the capability for use in either voltage regulators or in a current conveyor.

20 Claims, 5 Drawing Sheets

CLASS AB ENHANCED TRANSCONDUCTANCE SOURCE FOLLOWER

FIELD OF THE INVENTION

The present invention relates to high bandwidth, high transconductance electronic integrated circuits, and particularly to high bandwidth, high transconductance source follower amplifiers having class AB operation characteristics.

BACKGROUND OF THE INVENTION

High frequency electronic integrated circuits (IC) used in modern electronic communications and computing devices require high bandwidth amplifiers. Furthermore, the low voltages used in modem IC designs lead to a need for high bandwidth amplifiers having a high transconductance, that is, amplifiers capable of generating significant change in output current for a relatively small change in input voltage. Such devices ideally should also have high input impedance and a choice of high or low output impedance. And, because modem electronic devices are increasingly portable, battery-powered devices, it is also highly desirous that the high bandwidth amplifiers be as energy efficient as possible.

Traditionally, source follower amplifiers have been used to provide high bandwidth amplifier outputs. These circuits are well known in the art and are typically used to buffer signals and provide low output impedance circuits capable of driving loads at high frequency. However, traditionally designed source followers have relatively low transconductance, which limits their ability to drive loads, especially in modem, low voltage IC design. Traditional source followers also have the limitation that they are class A type amplifiers, with a maximum load current limited to the quiescent current in the buffer. Having a type A amplifier with large quiescent current is inherently energy inefficient.

Previous attempts to increase the load drive capability of low voltage source followers have focused on sensing the current in the source follower drain and folding it back to increase the effective transconductance of the device. These prior art high bandwidth, low voltage gain cells include, for instance, the circuits described in U.S. Patent Application Publication US 2002/0175761 A1 titled "High-Bandwidth Low-Voltage Gain Cell and Voltage Follower Having an Enhanced Transconductance" by Bach et al, the contents of which are hereby incorporated by reference.

These circuits achieve the required low voltage operation with high bandwidth and high transconductance, but operate essentially in a class A type mode, drawing significant current even when there is no input signal. Moreover, such circuits are limited in drive capability in one direction by the quiescent current.

To improve power consumption, there is a need for a high bandwidth, high transconductance source follower circuit that operates in a class AB mode, in which only a small current is drawn in the absence of an input signal and in which the drive current is not limited by the quiescent current in either the sink or source direction.

SUMMARY OF THE INVENTION

The current invention is a low voltage, high bandwidth, enhanced transconductance source follower circuit constructed from Metal Oxide Silicon Field Effect Transistors (MOSFET) devices, which operates in a class AB mode. The class AB mode operation allows significantly more than the quiescent current to be available for both sourcing and sinking the output, resulting in significantly reduced average power consumption when driving the same load. Moreover, both the enhanced transconductance and the class AB mode operation of this invention are achieved while maintaining the large bandwidth of traditional source follower designs. The circuit of this invention can be used in a variety of applications, including voltage regulators and current conveyors The high bandwidth, high conductance class AB source follower circuit of this invention uses a folded cascode device to effectively sense the drain current of the source follower device. The folded cascode sensing device feeds its source current to the gate of a common source device of the same type (NMOS or PMOS) as the source follower. The connections are such that this results in a current that is effectively a multiple of the sensed current being directed to the output load. Over-limit current load at the source follower drain is sensed by a common source device of the opposite type (NMOS or PMOS) and any necessary extra current from the over-limit sensor is added to the output load.

In one embodiment of the invention, a current source is gate connected to the drain of a current sensing device of the same type (PMOS or NMOS) such that sensing the need for increased current drives more current from the current source. This allows a drive current greater than the quiescent current.

DETAILED DESCRIPTION

During the course of this description like numbers will be used to identify like elements according to the different views that illustrate the invention.

Figure 1:
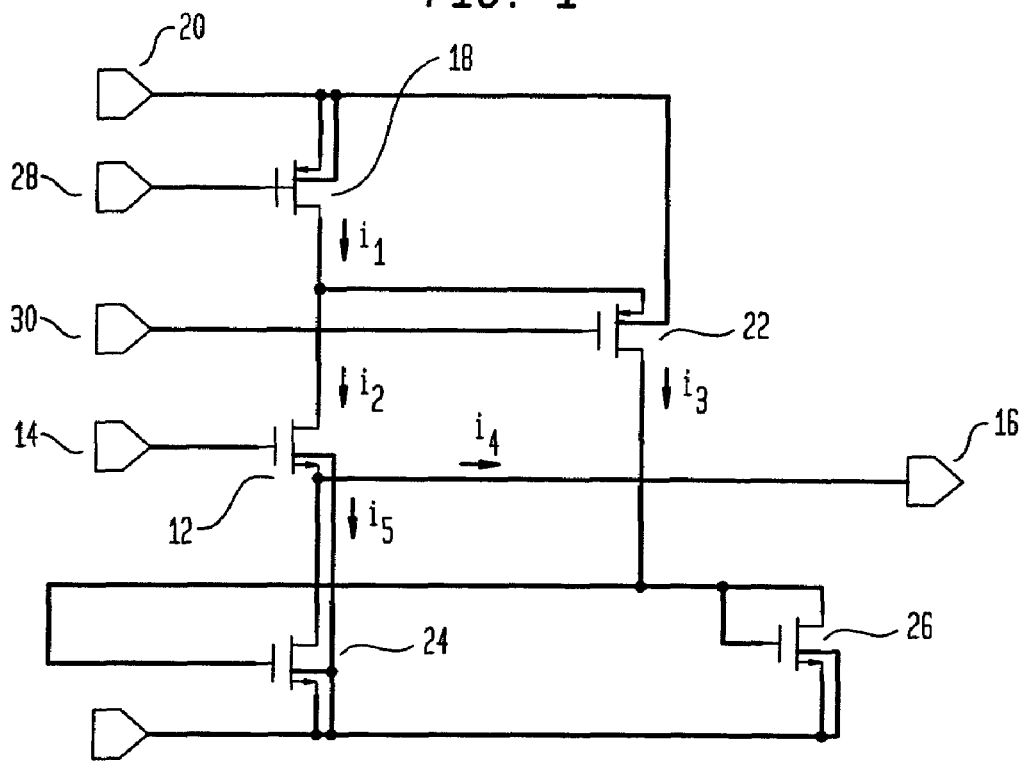
FIG. 1 is a schematic drawing of a type A enhanced transconductance source follower.

FIG. 1 is a schematic drawing of an enhanced transconductance source follower having class A behavior. Class A type amplifiers are limited to a maximum current output equal to the quiescent current, which makes their average power consumption very high. The class A type circuit of FIG. 1 provides a reference point for understanding the implementation and functioning of class AB circuits in accordance with this invention, as shown in FIGS. 2-6.

The circuit of FIG. 1 includes an NMOS source follower, transistor 12, having an input signal applied to its gate, or control terminal, at 13, and its source, a current flow terminal, is coupled to the output at 16. The circuit also has a current source, or supply, comprising the PMOS transistor 18. The drain, another current flow terminal, of PMOS 18 is connected to the rail voltage 20, and its gate is biased to a fixed voltage at 28. In this configuration, PMOS 18 acts as a current supply providing an essentially fixed current $i_1$. The current $i_2$ flowing into the drain of source follower NMOS 12 is sensed by the folded-cascode PMOS transistor 22. The sensing function of PMOS 22 results from constant current $i_1$ being the supply both to the drain of NMOS 12 and the source of PMOS 22. This results in PMOS 22 drain current $i_3$ effectively being the difference between current $i_2$ an $i_1$. The drain of PMOS 22 is connected to the gate of NMOS 24, with diode connected NMOS 26 functioning essentially as a biasing diode. The drain of NMOS 24 is connected to the source of the source follower, NMOS 12.

The operation of the type A enhanced transconductance source follower shown in FIG. 1 can be qualitatively understood by considering the currents that flow in response to a small change in signal voltage. When there is no signal voltage applied at 14, quiescent currents flow through all the transistors. In the quiescent state, bias voltages at 14, 28 and 30 are chosen such that the current $i_2$ flowing into NMOS 12 essentially matches the current $i_5$ flowing into the drain of NMOS 24. This tends to minimize the quiescent current $i_4$ flowing to the load and, with a sufficiently high impedance load, the quiescent value of current $i_4$ is essentially zero. When an input signal is applied at 14, the results is in an increase from the quiescent bias voltage at 14, the current flowing from drain to source in NMOS 12 increases and consequently current $i_2$ increases. Because source current $i_1$ is essentially fixed by the fixed bias voltage at 28, the increase in the drain current $i_2$ of NMOS 12's is sensed by PMOS 22 as a decrease in it's drain current $i_3$ This decrease in current i3 results in a lower voltage drop across diode connected NMOS 26, and consequently a decrease in the gate voltage on NMOS 24. This decreased gate voltage results in a lowering of the drain to source current across NMOS, which means that current $i_5$ decreases. So the net result of increase in signal voltage at 14, is an increase in current $i_2$ and a decrease in current $i_5$. The result is that the increase in the current $i_4$ flowing out to the load at 16 is not merely a function of the increase in current $i_2$. Instead it is a function of the combination of the increase in $i_2$ plus the difference between the quiescent value of $i_5$ and the now decreased value of $i_5$. This results in increased transconductance, that is increased change in current supplied to the output for a given change in signal voltage. However, in the circuit of FIG. 1, the maximum current that can be supplied to the output is limited by the fixed current i1 flowing through PMOS 18. Moreover, that fixed current i1 is also the quiescent current flowing through the circuit.

Figure 2:
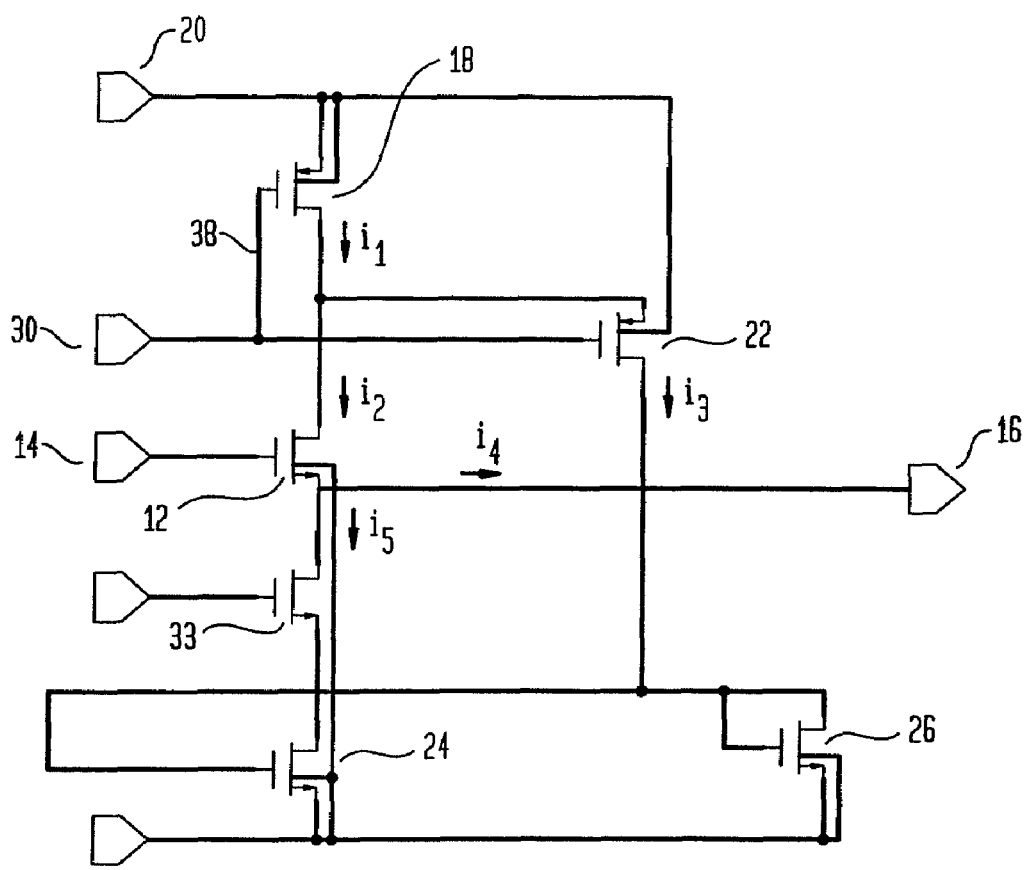
FIG. 2 is a schematic drawing of a type AB enhanced transconductance source follower in accordance with the present invention, implemented as a modification to the type A circuit of FIG. 1.

FIG. 2 is a schematic drawing of a first embodiment of a type AB enhanced transconductance source follower of this invention, implemented essentially as a modification to the type A enhanced transconductance source follower of FIG. 1. The class AB operation means that more that quiescent current is available for both sourcing and sinking the output, resulting in significantly reduced average power consumption in driving the same load. A significant difference between the class A amplifier of FIG. 1 and the class AB type amplifier of FIG. 2 is that in the circuit of FIG. 2, the gate of the current source PMOS 18 is tied directly to the gate of PMOS 22 by the conducting connecter 38. This allows the same cascode voltage at 30 to be applied to the gates of both PMOS 18 and PMOS 22. The result of this modification may be understood quantitatively by considering how currents in the circuit change from their quiescent values in response to a signal voltage applied at 14.

In a quiescent state, with no signal voltage at input 14, current $i_1$ is still essentially equal to the sum of currents $i_2$ and $i_3$. Furthermore, components and bias voltages are chosen so that in the quiescent state, current $i_5$ is set essentially equal to current $i_2$ so that current $i_4$ directed to a high impedance load is essentially zero. When the signal voltage at 14 increases, the drain to source current $i_2$ increases. This is sensed by folded cascode connected PMOS 22 as a decreased current $i_3$. A reduced current $i_3$ also means a reduced voltage to the gate of common source NMOS 24 because of the reduced current through diode connected NMOS 26. This in turn results in a reduced current $i_5$, giving improved transconductance as in the circuit of FIG. 1. However, the gate of the current source PMOS 18 is now tied to the gate of the current sensing PMOS 22. As the current in PMOS 22 decreases, the voltage difference between the gate of PMOS 18 and the rail voltage at 20 increases, and produces an increase in current $i_1$. This increase in current $i_1$ may be seen as a consequence of the voltage at 30 being essentially the sum of the voltage across diode connected NMOS 26 and the gate to drain voltage of PMOS 22. A decrease in current $i_3$ effectively decreases both of these voltages and results in an increased voltage difference between point 30 and the fixed upper rail 20. This means that the maximum load current of the circuit is not limited to the quiescent value of current $i_1$. In the circuit of FIG. 2, the maximum load current is now essentially equal to the maximum current that can be carried by PMOS 18 when fully turned on. The direct link 38 of the gate of current source PMOS 18 to the gate of current sensing PMOS 22 effectively gives the source follower NMOS 12 type AB amplifier characteristics. The ability to have a significantly lower quiescent current to enable driving the same load current means that the average power consumption of the circuit can be considerably reduced.

Cascode NMOS 33 is optionally included to more closely control conductance by effectively having two transistors 33 and 24 in parallel with the output load and having a fixed bias voltage applied to transistor 33.

Figure 3:
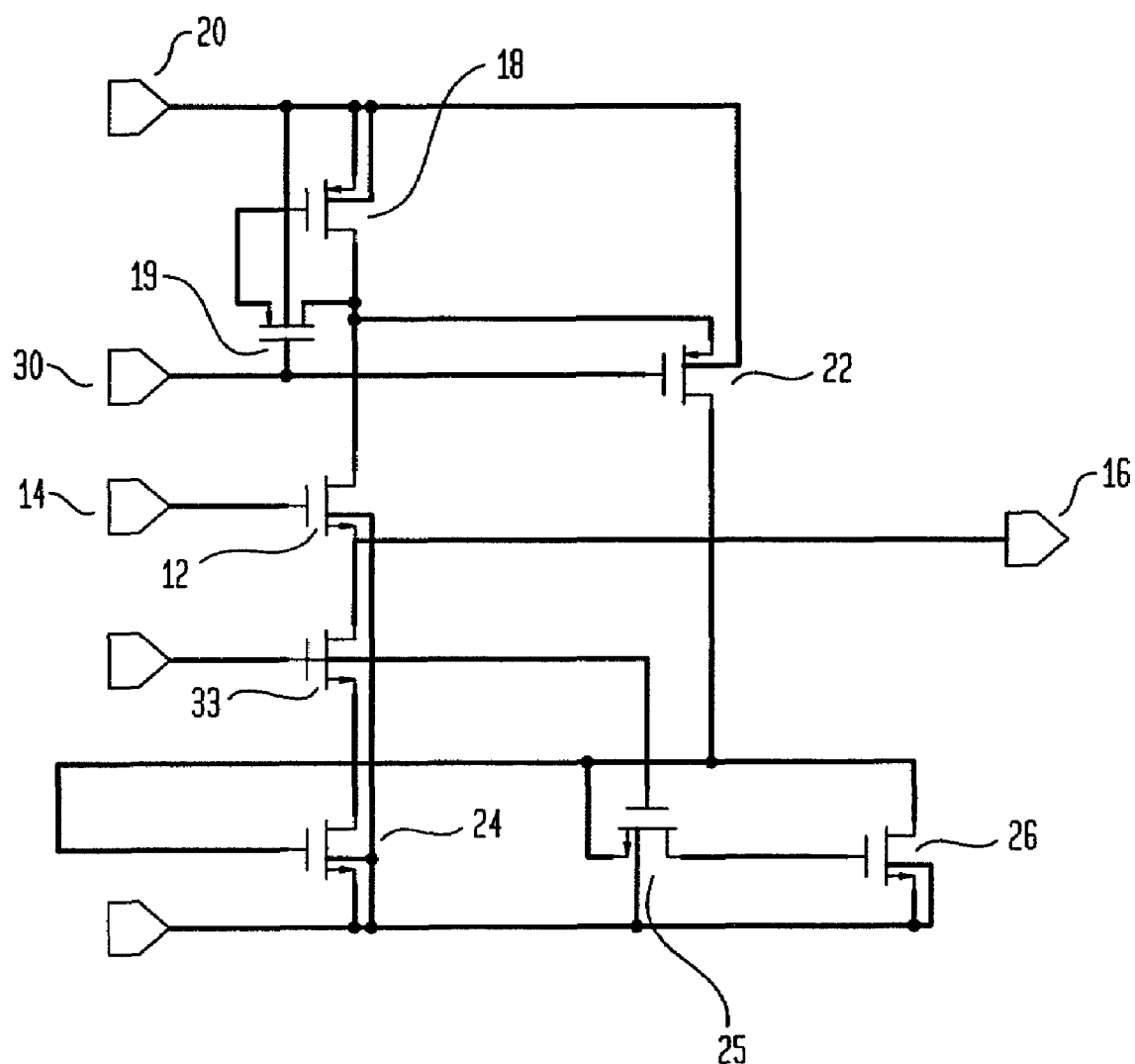
FIG. 3 is a schematic drawing of an NMOS type AB enhanced transconductance source follower with additional speed up transistors, in accordance with the present invention.

In a further embodiment of this invention, shown in FIG. 3, the frequency response of the amplifier output can be further improved by placing impedances at the gates of the transistors 18 and 26. Having impedances at their gates also effectively makes the two transistors 18 and 26 current mirrors. In particular, short circuit 38 of FIG. 2 may be replaced by a PMOS transistor 19 with source connected to the gate of PMOS 18, drain connected to the drain of PMOS 18, gate connected to the gate of PMOS 22 and the tub or body connected to voltage point 20. The effect of this additional transistor 19 includes speeding up the response of PMOS 18 when a change in current is detected by PMOS 22. A further aspect of the embodiment of FIG. 3 is an additional PMOS transistor 25. This additional transistor 25 adds capacitance to the base of PMOS 26. This is done as shown in FIG. 3 by having the drain of PMOS 25 connected to the gate of PMOS 26, while the tub or body of PMOS 25 is connected to ground. The source of PMOS 25 is connected to the drain of NMOS 22. The gate of PMOS 25 is biased to the same voltage as cascode transistor 33. The net result of theses connections is an improvement in the high frequency response of the amplifier output circuit as compared to the circuit of FIG. 2.

Figure 4:
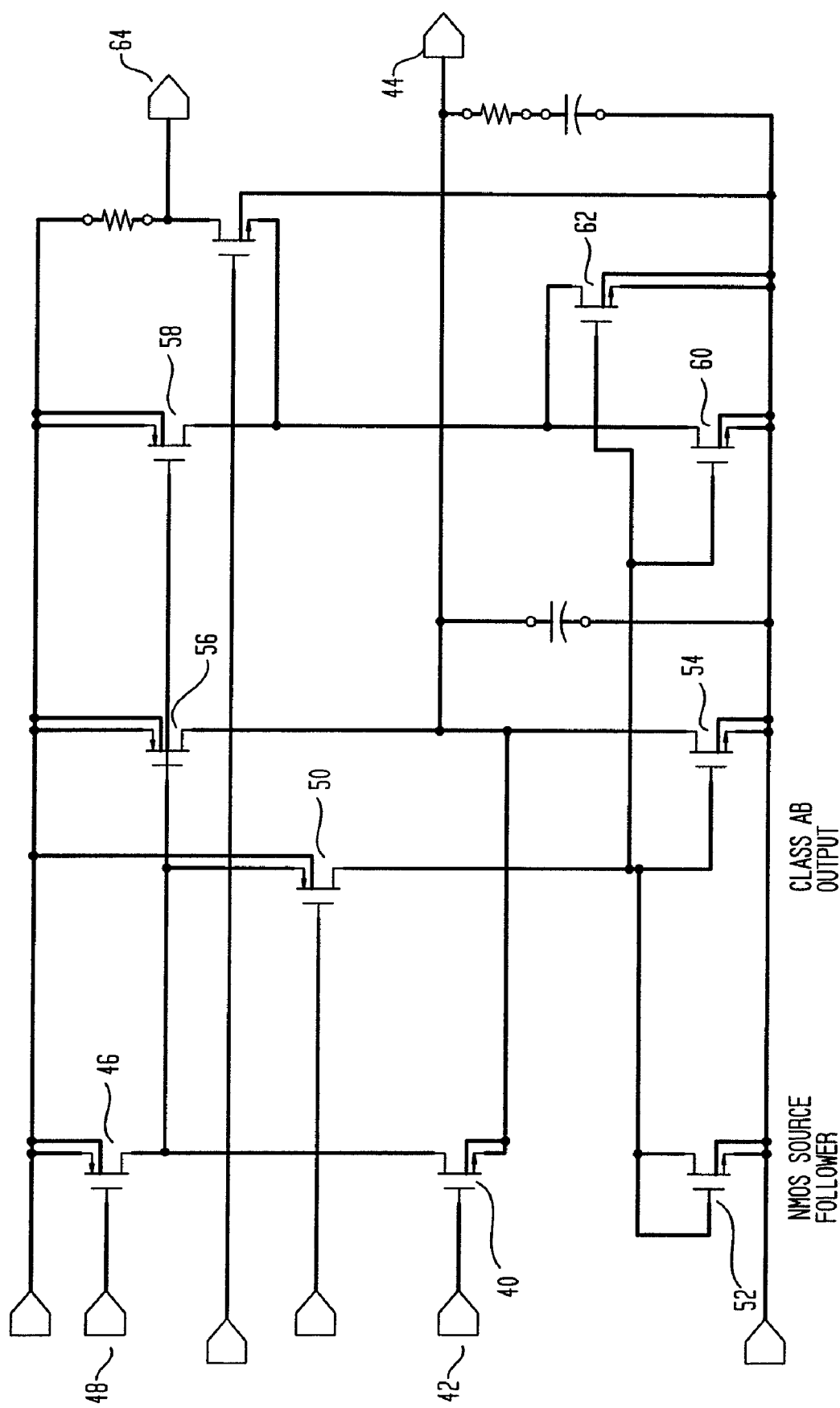
FIG. 4 is a schematic drawing of an NMOS source follower with class AB output in accordance with the present invention, operating as a current conveyor with replica output devices into a cascode device with a load.

FIG. 4 is a schematic drawing of an NMOS source follower with class AB output operating as a current conveyor with replica output devices into a cascode device with a load.

The five transistors 40, 46, 50, 52 and 54 of this circuit function in a manner that is broadly analogous to the behavior of the five transistor class A amplifier having enhanced transconductance diagramed in FIG. 1. The functioning of transistors 40, 46, 50, 52 and 54 may be understood at a qualitative level in the same manner. NMOS 40 is connected as a source follower with a signal input and quiescent offset voltage being applied to its gate at 42. The source and tub of NMOS 40 are connected to output 44. PMOS 46 acts essentially as a current source, or supply, in a manner analogous to PMOS 18 in FIG. 1. A constant bias voltage at 48 is applied to the gate of PMOS 46, resulting in a constant current following from source to drain. The drain of PMOS 46 is connected to both the drain of source follower NMOS 40 and to the source of current sensing PMOS 50, which is connected in a folded cascode manner. The drain of PMOS 50 is connected to the source of diode connected NMOS 52 and to the gate of common source NMOS 54. As before, when the signal input at 42 is zero, quiescent currents are such that the current steered toward output 44 is essentially zero. When the signal voltage increases, the current through NMOS 40 increases, which is sensed by PMOS 50. This results in a reduction in current flowing from the drain of PMOS 50 that is a function of the increase in current flowing through NMOS 40. This decrease in current is effectively multiplied by common source NMOS 54. The combined increase current from NMOS 40 and the related but multiplied decrease in current flowing across NMOS 54, are both steered toward output 44, in a similar fashion to the circuit of FIG. 1. The difference between the circuit of FIG. 3 and that of FIG. 1 is, that when the input signal at 42 increases to the point where all of the current from current source PMOS 46 is flowing through source follower NMOS 40 the circuit does not "max out". Instead, there is an additional common source transistor, PMOS 56, which acts effectively both as an over limit current sensor and as an auxiliarly current source or supply. PMOS 56 is turned off in the quiescent state, but when PMOS 50 turns off, because of an over limit current condition in which essentially all the current supplied by PMOS 46 is flowing through NMOS 40, the reduced voltage drop across diode connected PMOS 52 turns auxiliary current source, or supply, PMOS 56 on. The current flowing through PMOS 56 is steered towards the output 44, adding the necessary additional current to correspond to the increased input signal at 42. The addition of PMOS 56 effectively allows the source follower NMOS 40 to act in a class AB manner in the supply or push mode. In addition, if common source NMOS 54 has a larger current capacity than current source PMOS 46, the circuit functions essentially in a class AB manner in the sink or pull mode. The net result is that the six transistor 40, 46, 50, 52, 54 and 56 portion of the circuit of FIG. 4 can supply a total drive current significantly greater than the quiescent current in the circuit. This can be seen from the fact that the quiescent current is effectively the fixed current flowing through current source PMOS 46, whereas the available drive current includes the additional current that can be supplied through PMOS 56, which is turned off in the quiescent state.

If PMOS transistors 46 and 56 are matched, twice the quiescent current can flow, significantly reducing average power consumption and battery requirements.

The remaining components in the circuit of FIG. 4, including PMOS 58, PMOS 68, NMOS 60 and NMOS 62 form a current conveyor, providing a mirrored current to output 64 in addition to the voltage following output at 44.

In the output at 64, the current is a precise conversion of the input voltage signal. In contrast, at the output at 44, the voltage is a precise conversion of the input signal voltage.

Figure 5:
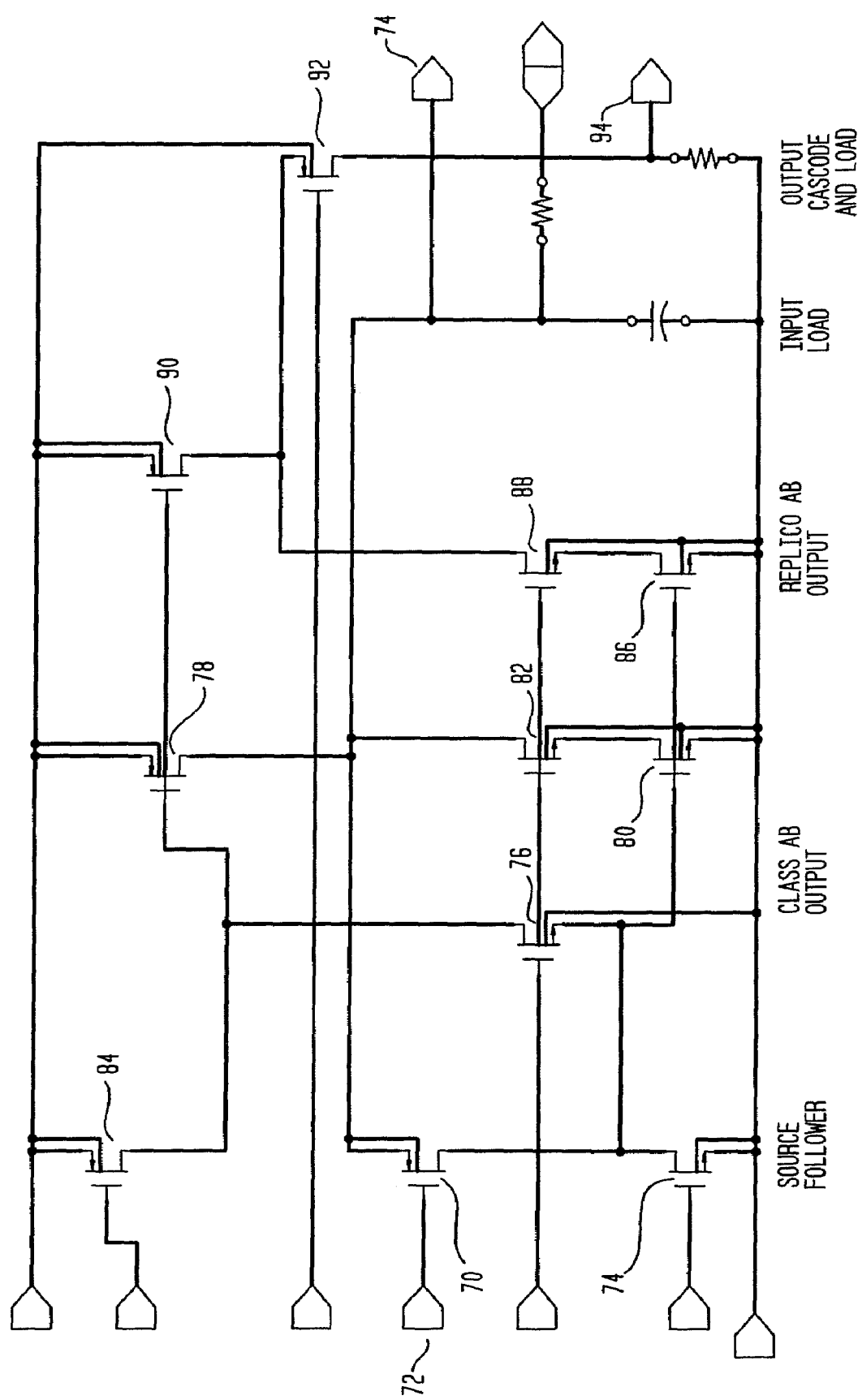
FIG. 5 is a schematic drawing of a PMOS source follower with class AB output in accordance with the present invention, operating as a current conveyor with replica output devices into a cascode device with a load.

FIG. 5 is a schematic drawing of an embodiment of the present invention in which a PMOS source follower with class AB output operates as a current conveyor with replica output devices into a cascode device with a load.

Figure 6:
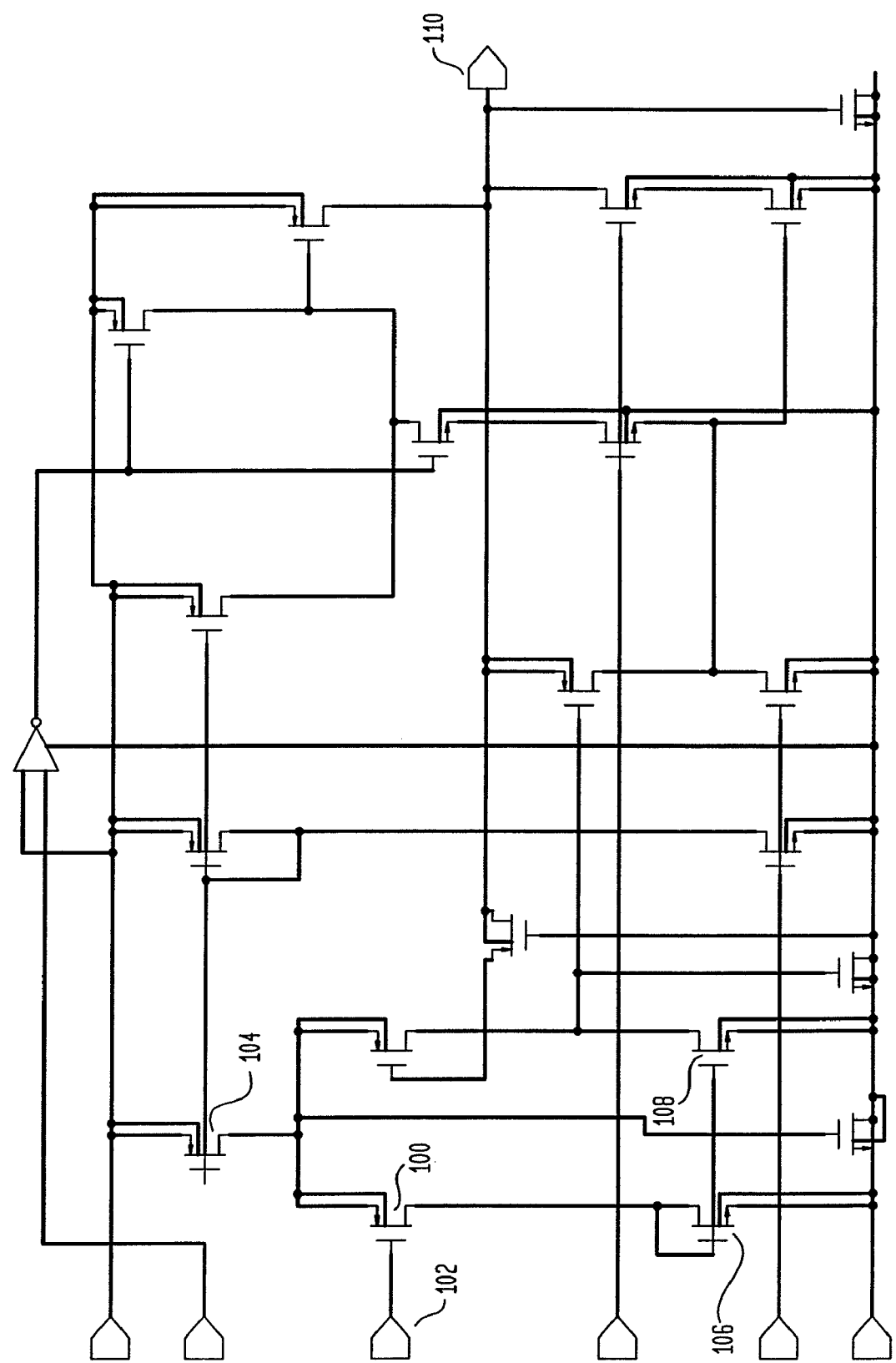
FIG. 6 is a schematic drawing of a class AB source follower in accordance with the present invention, used to buffer a regulator output and provide high current drive with low output impedance and low quiescent power.

In FIG. 6, transistors 70, 74, 76, 78, 80, 82 and 84 form the class AB source follower. PMOS 70 is connected as a source follower, with signal and quiescent bias voltage supplied at 72, and output to 74. NMOS 74 acts as a current source or supply. NMOS 76 acts as a current sensing device, sensing a change in the drain current of source follower PMOS 70 when the input signal at connector 72 changes. The current change sensed by NMOS 76 is multiplied by common source NMOS 78 and steered towards the output at 74. Common source NMOS 80 is turned off in the quiescent state, and acts both as an over current limit sensing device and as a second, auxiliary current supply. When all available current supplied by current source PMOS 74 is steered through the source follower 70, NMOS 80 turns on and steers the necessary extra current directly to the output connector 74, providing class AB operation.

Transistors 86, 88, 90 and 90 operate as a current conveyor providing a replica current-to-current output 94.

FIG. 6 is a schematic drawing of a class AB source follower, in accordance with the present invention, used to buffer a regulator output and provide high current drive with low output impedance and low quiescent power.

PMOS 100 acts as a source follower with signal and quiescent voltage supplied to its gate at 102.

The remainder of the circuit in FIG. 6 acts so that a regulator voltage is buffered and a high current drive is supplied with a low impedance output at 110.

While the invention has been described with reference to the preferred embodiment thereof, it will be appreciated by those of ordinary skill in the art that modifications can be made to the structure and elements of the invention without departing from the spirit and scope of the invention as a whole.

What is claimed is:

1. A class AB enhanced transconductance source following circuit, comprising:
   a source follower having an output load;
   a first current supply having a maximum operating current;
   a folded cascode device capable of sensing the source current of said source follower;
   a first common source device of the same type as said source follower, capable of multiplying said sensed current and feeding said multiplied current to the output load; and
   a second common source device of the opposite type as said source follower, capable of sensing an over limit current condition when the current at the drain of said source follower exceeds said maximum operating current of said first current supply and, on sensing said over current limit being capable of acting as a second current supply, supplying current to said output load.

2. The circuit of claim 1 in which said source follower is a PMOS device; said first current supply is a PMOS device; said folded cascode device is a PMOS device; said first common source device is an NMOS device; and, said second common source device is an NMOS device.

3. The circuit of claim 2 in which a current flow terminal of said first current supply device is connected to a current flow terminal of said source follower device, to a current flow terminal of said folded cascode device and to a control terminal of said second common source device; and, a current flow terminal of said folded cascode device is connected to a control terminal of said first common source device.

4. The circuit of claim 2 further including a current conveyor, whereby a high drive current is supplied to a high impedance output.

5. The circuit of claim 2 further including a voltage regulator output, whereby a high drive current is supplied to a low impedance output.

6. The circuit of claim 1 in which said source follower is a PMOS device; said first current supply is an NMOS device; said folded cascode device is an NMOS device; said first common source device is a PMOS device; and, said second common source device is a PMOS device.

7. The circuit of claim 6 in which a current flow terminal of said first current supply is connected to a current flow terminal of said source follower, to a current flow terminal of said folded cascode device and to a control terminal of said second common source device; and, a current flow terminal of said folded cascode device is connected to a control terminal of said first common source device.

8. The circuit of claim 6 further including a current conveyor, whereby a high drive current is supplied to a high impedance output.

9. The circuit of claim 6 further including a voltage regulator output, whereby a high drive current is supplied to a low impedance output.

10. A high band width, enhanced transconductance class AB source follower amplifier output circuit, comprising:
 a first CMOS device of a first type, connected as a source follower having an output load;
 a first CMOS device of a second type, complementary to said first type, connected as a current source; and
 a second CMOS device of said second type, connected as a current sensor capable of sensing the drain current of said CMOS source follower, and capable of using said sensed current to control the current in the current source and of multiplying said sensed current and feeding said multiplied current to the output load.

11. The circuit of claim 10 in which:
 a current flow terminal of said second CMOS of a second type current sensing device is connected to a current flow terminal of said first CMOS source following device and to a current flow terminal of said first CMOS current source device whereby said first CMOS drain current is sensed; and
 the gate of said first CMOS current source device is connected to the gate of said second CMOS of said second type whereby said current in said current source is controlled.

12. The circuit of claim 11 further including:
 a second CMOS device of said first type connected to the drain of said second CMOS current sensing device; and
 a third CMOS device of said first type, cascode connected to the drain of said first CMOS of said first type source following device and the gate of said third CMOS device of said first type being connected to the drain of said second CMOS current sensing device of said second type, whereby said sensed current is multiplied and fed to said output load.

13. The circuit of claim 12 further including:
 a third CMOS device of said second type connected so as to provide capacitance in the gate of said first CMOS current source device of said second type.

14. The circuit of claim 13 further including:
 a third CMOS device of said first type connected so as to provide capacitance in the gate of said second CMOS diode connected device of said first type.

15. A method of performing class AB amplification with enhanced transconductance, said method comprising the steps of:
 providing an input signal to a control terminal of a source follower, said source follower having coupling to an output load;
 providing a current from a first current supply to a current flow terminal of said source follower, said first current supply having a maximum operating current;
 sensing current through said source follower by means of a folded cascode device;
 multiplying said sensed current and feeding said multiplied current to the output load via a first common source device of the same type as said source follower; and
 sensing an over-limit current condition when the current through said source follower exceeds said maximum operating current of said first current supply and, on sensing said over-limit current condition being capable of acting as a second current supply, supplying current to said output load by means of a second common source device of the opposite type as said source follower.

16. A method of providing a high bandwidth, enhanced transconductance class AB source follower amplifier output circuit, comprising the steps of:
 providing a signal to a first NMOS device, connected as a source follower having an output load;
 providing a current from a first PMOS device, connected as a current source;
 sensing the drain current of said NMOS source follower using a second PMOS device, connected as a current sensor;
 using said sensed current to control the current in the current source; and multiplying said sensed current and feeding said multiplied current to the output load.

17. The method of claim 16 wherein:
 the source of said second PMOS current sensing device is connected to the drain of said first NMOS source following device and to the drain of said first PMOS current source device whereby said first NMOS drain current is sensed; and
 the gate of said first PMOS current source device is connected to the gate of said second PMOS whereby said current in said current source is controlled.

18. The method of claim 17 further including the steps of:
 providing a second NMOS device diode connected to the drain of said second PMOS current sensing device;
 multiplying said sensed current by means of a third NMOS device, said third NMOS device being cascode connected to the drain of said first NMOS source following device and the gate of said third NMOS device being connected to the drain of said second PMOS current sensing device; and
 feeding said multiplied, sensed current to said output load.

19. The method of claim 18 further including:
 providing a capacitance in the gate of said first PMOS current source device by means of an appropriately connected third PMOS device.

20. The method of claim 19 further including:
 providing a capacitance in the gate of said second NMOS diode connected device by means of an appropriately connected third NMOS device.

* * * * *